United States Patent
Duff

(10) Patent No.: US 9,442,136 B2
(45) Date of Patent: Sep. 13, 2016

(54) REAL-TIME OSCILLOSCOPE FOR GENERATING A FAST REAL-TIME EYE DIAGRAM

(71) Applicant: Keysight Technologies, Inc., Minneapolis, MN (US)

(72) Inventor: Christopher P. Duff, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 367 days.

(21) Appl. No.: 14/016,129

(22) Filed: Sep. 1, 2013

(65) Prior Publication Data
US 2015/0066409 A1    Mar. 5, 2015

(51) Int. Cl.
G06F 19/00 (2011.01)
G01R 13/02 (2006.01)
G01R 31/317 (2006.01)

(52) U.S. Cl.
CPC ....... *G01R 13/0254* (2013.01); *G01R 13/0236* (2013.01); *G01R 31/3171* (2013.01)

(58) Field of Classification Search
CPC ............ G01R 31/31709; G01R 29/26; G01R 31/31922
USPC ..................... 702/67, 64, 182–185
See application file for complete search history.

(56) References Cited

U.S. PATENT DOCUMENTS

| | | | | |
|---|---|---|---|---|
| 7,681,091 B2* | 3/2010 | Hafed | | 714/700 |
| 8,074,126 B1* | 12/2011 | Qian et al. | | 714/704 |
| 2005/0031029 A1* | 2/2005 | Yamaguchi et al. | | 375/226 |
| 2006/0069967 A1* | 3/2006 | Almy et al. | | 714/724 |

OTHER PUBLICATIONS

Agilent Technologies, "Agilent 86100B Wide-Bandwidth Oscilloscope", Technical Specification, 5988-5311EN, Aug. 27, 2003, 22 pages.
Keysight Technologies, "Infiniium 90000 X-Series Oscilloscopes", Data Sheet, 5990-5271EN, Feb. 11, 2016, 38 pages.

* cited by examiner

*Primary Examiner* — Edward Raymond

(57) ABSTRACT

Disclosed is an improved real-time oscilloscope ("IRTO") for generating a fast worst-case real-time eye diagram from an input signal. The IRTO may include signal conditioning circuitry, a digitizer, an acquisition memory, a clock and data recovery ("CDR") module, a worst-case real-time eye diagram rendering ("WRTER") module, and a display.

20 Claims, 9 Drawing Sheets

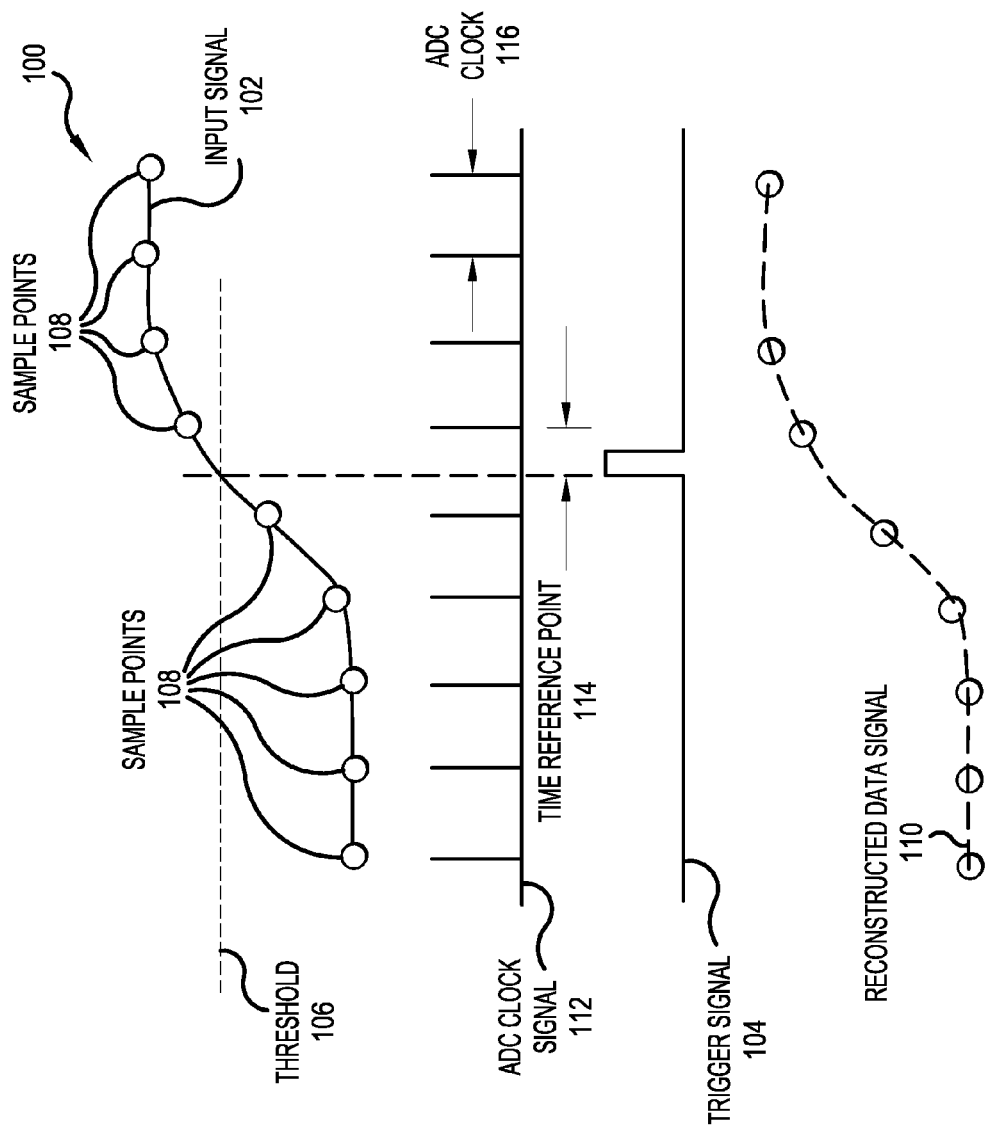

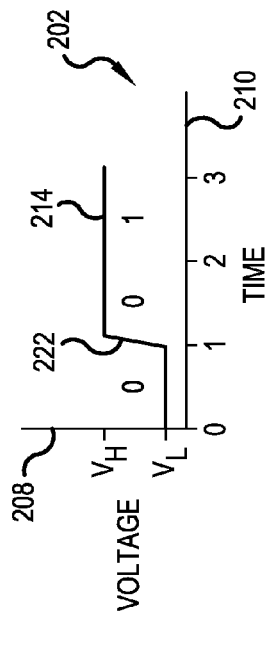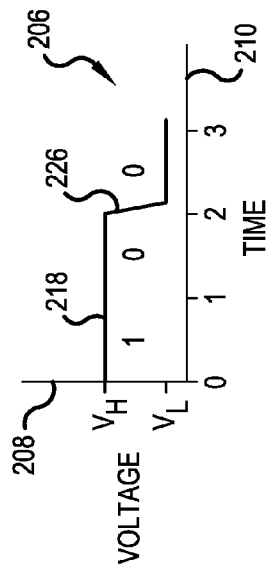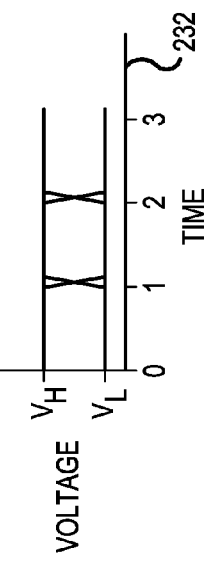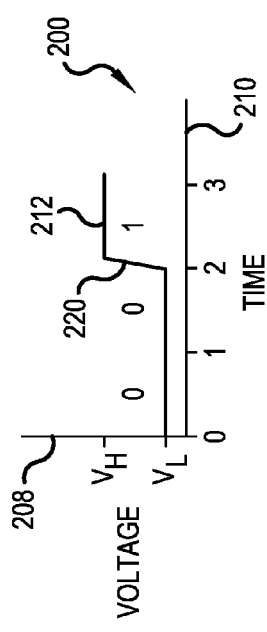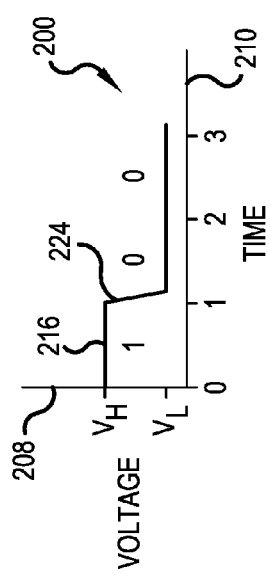

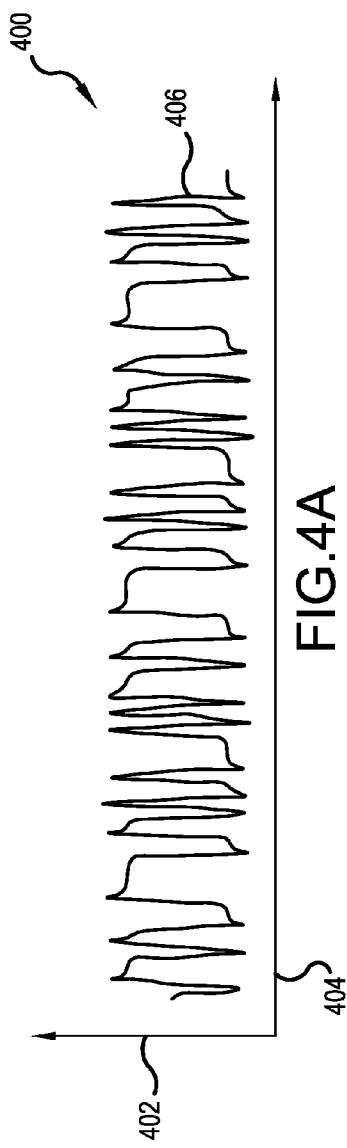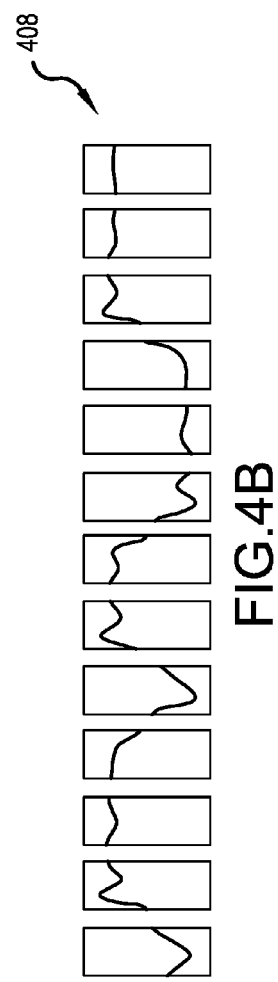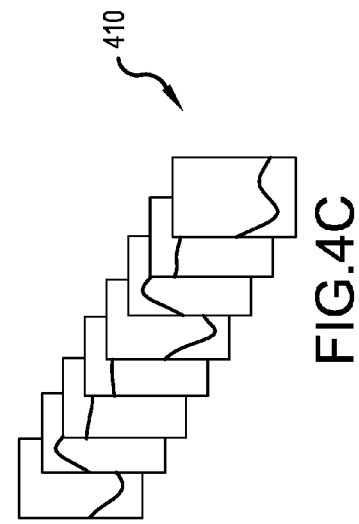

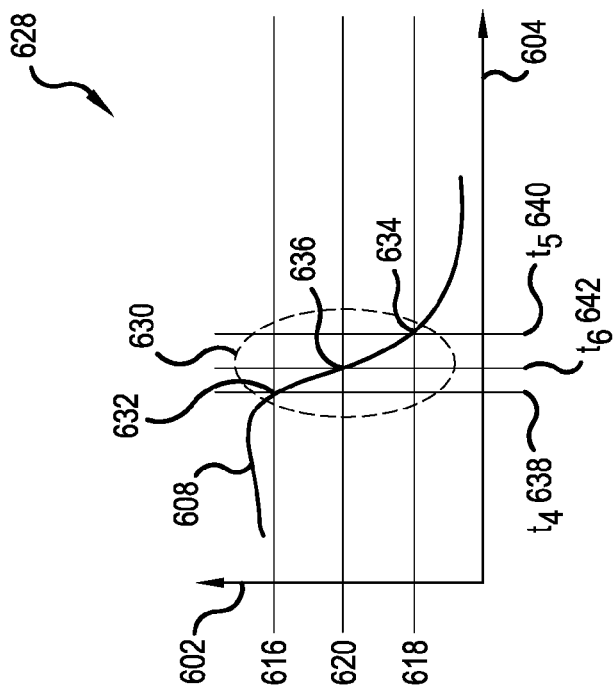
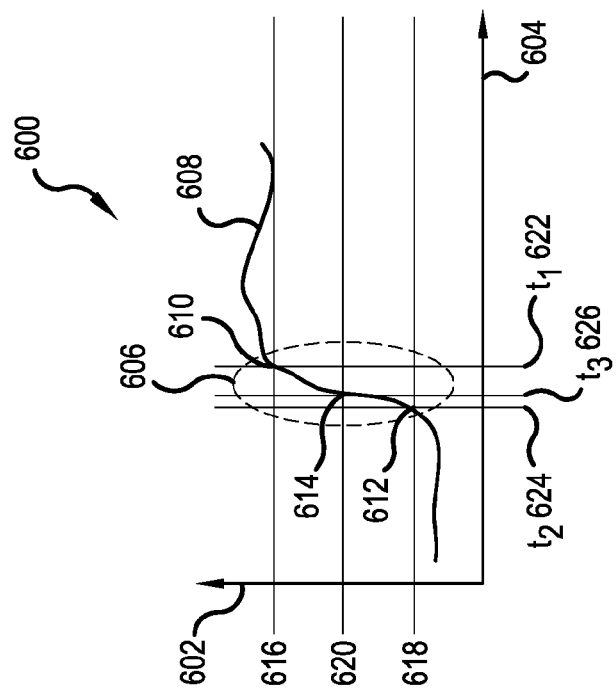

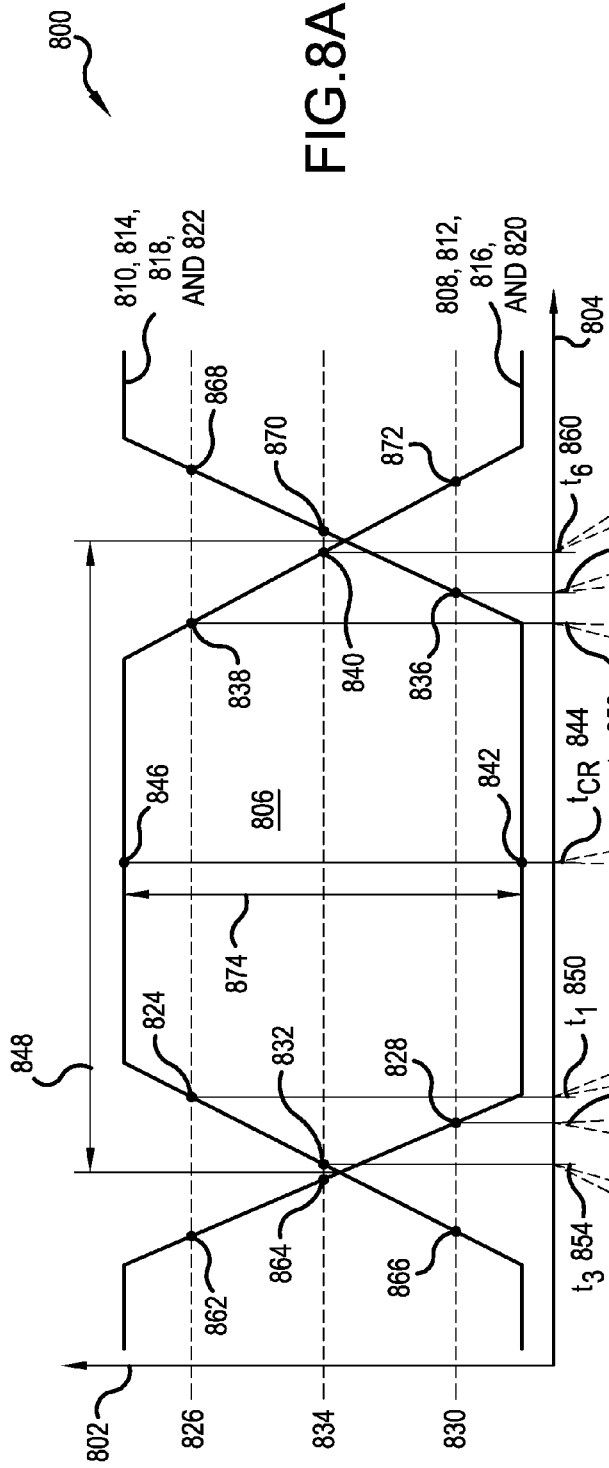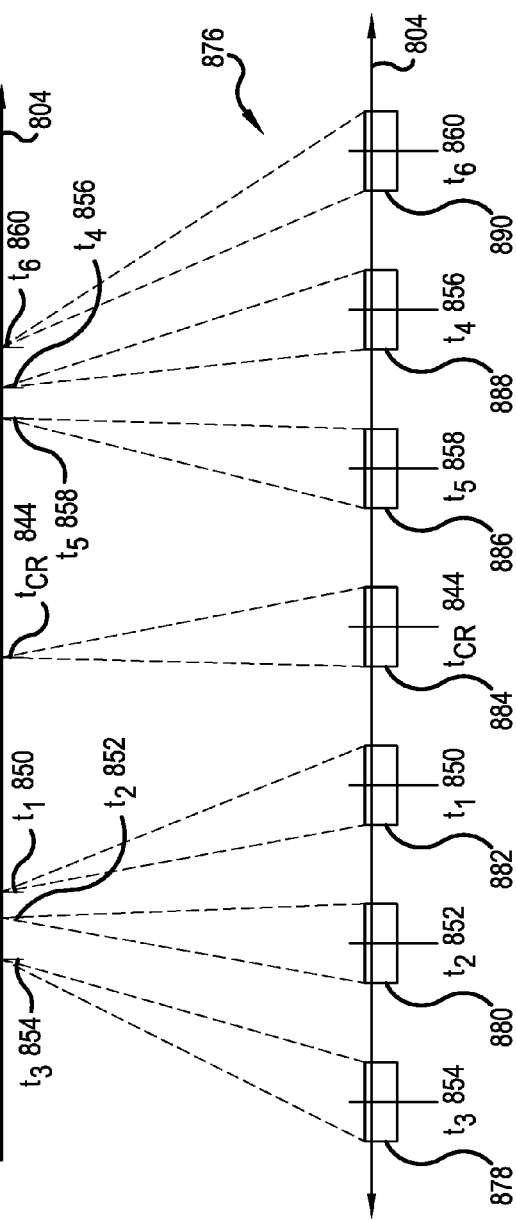

REAL-TIME OSCILLOSCOPE FOR GENERATING A FAST REAL-TIME EYE DIAGRAM

BACKGROUND OF THE INVENTION

1. Field of the Invention

The invention relates in general to the measurement of digital signals and, in particular, to a method and system for determining characteristics of a digital signal utilizing an eye diagram generated from the measured characteristics of the digital signal.

2. Related Art

An eye diagram is an important analysis tool in the study of serial data communication systems. Specifically, an eye diagram analysis is an important tool for studying the behavior of high-speed digital electrical and optical communications signals.

An eye diagram is formed by overlapping signal waveforms of a digital data signal over a specified time interval. Generally, the eye diagram is a composite image of the waveform shapes of logic one-zero combinations of the digital data signal, where the composite image is typically displayed on an oscilloscope or other suitable display device. Eye diagrams of high speed digital signals are often generated using either an equivalent-time sampling oscilloscope (such as, for example, an 86100B sampling oscilloscope produced by Agilent Technologies of Santa Clara, Calif.) or a real-time oscilloscope (such as, for example, an Infiniium 90000 X-Series oscilloscope produced by Agilent Technologies). In general, an eye diagram is a conventional format for representing parametric information about a digital signal and provides a qualitative means to evaluate link performance and to troubleshoot system issues.

By measuring and analyzing features of the generated eye diagram, various characteristics of a digital data signal, such as signal-to-noise ratio, extinction ratio, jitter, duty cycle distortion, and the like, and its channel impairments such as inter-symbol interference ("ISI") can be readily determined.

In general, a real-time oscilloscope, sometimes called a "single-shot" scope, captures an entire waveform of an input signal on each trigger event. On the other hand, an equivalent time sampling oscilloscope, sometimes simply called a "sampling scope," measures only the instantaneous amplitude of the waveform at the sampling instant. In contrast to the real-time oscilloscope, the input signal is only sampled once per trigger. As such, an advantage of a real-time oscilloscope is that it is able to display one-time transient events, measures cycle to cycle jitter directly, and does not require an explicit trigger or a repetitive waveform. A disadvantage is that it generally requires large record lengths and deep memory.

Stating that a real-time oscilloscope captures an entire waveform on each trigger event means that a large number of data points are captured in one continuous record. To better understand this type of data acquisition, a real-time oscilloscope may be thought as being an extremely fast analog-to-digital converter ("ADC") in which the sample rate determines the sample spacing and the memory depth determines the number of points that will be displayed. In order to capture any waveform, the ADC sampling rate needs to be significantly faster than the frequency of the incoming waveform such as at least twice the Nyquist sampling rate. This sample rate, which presently can be as fast as 80 Giga-samples per second ("GSa/s"), determines the bandwidth which currently extends to about 32 GHz.

In FIG. 1, a plot 100 of an example of an input signal 102 is shown. In this example, the input signal 102 is sampled by a real-time oscilloscope. The real-time oscilloscope may be triggered on a feature of the input signal 102 itself, as an example, the trigger signal 104 may occur when the amplitude of the waveform of the input signal 102 reaches a certain threshold 106. At that point, the real-time oscilloscope starts converting the analog waveform of the input signal 102 to digital data sample points 108 at a rate asynchronous and unrelated to the data rate of the input signal 102. The sampled points 108 may then be used to create a digital reconstructed data signal 110 that is the digitized version of the input signal 102. That conversion rate, known as the sampling rate, is typically derived from either an internal clock signal of the real-time oscilloscope or an external provided clock, herein generally referred to a "ADC clock signal 112." In general, the real-time oscilloscope preforms a process that includes sampling the amplitude of the waveform of the input signal 102, storing that value in memory, and continuing to the next sample until the a predefined length of the input signal 102 has been captured by the real-time oscilloscope. The main job of the trigger signal 104 is to provide a horizontal time reference point 114 for the incoming data of the input signal 102 relative to a period 116 of the clock signal 112.

In FIGS. 2A through 2D, four plots 200, 202, 204, and 206 of voltage 208 versus time 210 for four example digital signals 212, 214, 216, and 218 are shown that are three time periods long and vary in amplitude between a low Voltage $V_L$ and high voltage $V_H$. In these examples, FIGS. 2A through 2D show four patterns that illustrate the transitions that can occur during the time interval. For example, digital signals 212, 214, 216, and 218 may represent, for example, 001, 011, 100, and 110, respectively. In this example, when the digital signal voltage amplitude is at or below the $V_L$, it is assigned a "0" value. Alternatively, when the digital signal voltage amplitude is at or above the $V_H$, it is assigned a "1" value. In this example, the rising edge transitions 220 and 222 are shown when the digital signal changes from a "0" value to a "1" value. Similarly, in this example, the failing edge transitions 224 and 226 are shown when the digital signal changes from a "1" value to a "0" value. When the four patterns of FIGS. 2A through 2D are superimposed on each other the resulting pattern plot 228 of voltage 230 versus time 232 shown in FIG. 2E is known as an eye diagram.

In FIG. 3, a plot 300 of an eye diagram of voltage 302 versus time 304 is shown. The eye diagram plot 300 may assist in determining noise, jitter, distortion, and signal strength among many other measurements. It gives an overall statistical view of the system under test's performance as it looks at an overlay of every combination of bits in the bit steam of a digitized received input signal 102. As such, by looking at plot 300 of the eye diagram a number of signal characteristics of the input signal 102 may be derived. As an example, a zero level 306, one-level 308, eye amplitude 310, rise time 312, fall time 314, eye height 316, eye width 318, jitter 320, and bit rate 322 may be readily approximated by visual inspection of the plot 300 of the eye diagram.

In this example, the zero level 306 is a measure of the mean value of the logical "0" of an eye diagram plot 300 and the one level 308 is a measure of the mean value of the logical "1" of an eye diagram plot 300. The eye amplitude 310 is the difference between the logic 1 level and the logic 0 level histogram mean values of an eye diagram plot 300. The rise time 312 is a measure of the transition time of the data from a 10% level to a 90% level on the upward slope of the eye diagram plot 300 and the fall time 314 is a measure of the transition time of the data from a 90% level to a 10% level on the downward slope of an eye diagram plot 300. The eye height 316 is a measure of the vertical opening of an eye diagram plot 300 where an ideal eye opening would be measured from the one level 308 to the zero level 306. However, as noise on the input signal 102 increases, the effect will be to cause the eye diagram to "close." As such, the eye height 316 measurement determines the eye diagram closure due to noise on the input signal 102. Similarly, the eye width 318 is a measure of the horizontal opening of an eye diagram plot 300. Ideally, the eye width 318 would be measured between the crossing points 324 and 326 of the eye diagram plot 300. However, jitter may appear on the input signal 102 and influence the eye opening where jitter is a measure of signal quality and is defined as the measure of variance in signal characteristics such as the variation in time of the signal to its ideal location. One form of jitter that is readily visible on the eye diagram plot 300 is deterministic jitter 320 which is the deviation of a transition from its ideal time caused by reflections relative to other transitions. Finally, the bit rate 322 (also known as the data rate) is the inverse of bit period where the bit period is a measure of the horizontal opening of an eye diagram plot 322 at the crossing points 324 and 326 of the eye diagram. The bit rate 322 may also be referred to as a symbol cell or unit interval ("UI") width of the eye diagram opening 318 which corresponds to one bit period of the input signal 102.

Turning to FIG. 4A, a plot 400 of voltage 402 versus time 404 is shown of an example acquired waveform of an input signal 406 received by a real-time oscilloscope. The real-time oscilloscope may utilize a precise clock (such as the ADC clock signal 112 shown in FIG. 1) to sample the input signal 406 into a plurality of waveform segments 408 (each having a UI width), shown in FIG. 4B, which may be overlaid 410 on top of each other, as shown in FIG. 4C, so as to create one plot of the eye diagram plot 300 (as shown in FIG. 3).

Due to random jitter and noise as well as deterministic jitter caused by various pattern lengths in the data a real-time oscilloscope an acquired input signal 102 (or 406) may require millions of bits to fully appreciate the input signal 102 (or 406). As an example, a real-time oscilloscope having a sampling rate of 40 GSa/s would produce 40 million sample points 108 for a 1 millisecond ("ms") capture of the input signal 102. If, as an example, the input signal 102 was a digital signal having 400,000 bits of information that repeats every 1 ms, the reconstructed data signal 110 would have 40 million sample points 108 and every bit in the input signal 102 would have 100 sample points or 100 to 1 oversampling of data relative to the ADC clock of the input signal 102. As another example, a real-time oscilloscope having a sampling rate of 80 GSa/s would produce 160 million sample points of raw data for a 2 ms input signal 102.

As such, to fully construct an eye diagram that begins to accurately represent an input signal 102, a very large amount of data needs to be processed because the signal acquisition of the digital signal 102 may contain millions of bits of data and every bit may contain a large number of sample points. This may result in hundreds of millions of data points that need to be displayed on the oscilloscope display screen in order to construct the entire eye diagram. This may take a long time because the oscilloscope needs to calculate both voltage and time coordinates for every point that is going to be displayed on the display screen. Such a length of time can negatively affect the efficiency and profitability of real-time oscilloscope and others that use the real-time oscilloscope to perform eye diagram analysis. Additionally, most users care more about how an eye diagram closes into its center than they do about the generation of a fully detailed eye diagram from the digital data.

As such, there is a need for an improved real-time oscilloscope that utilizes an improved technique for generating a real-time eye diagram that provides for a reduction in test time.

SUMMARY

Disclosed is an improved real-time oscilloscope ("IRTO") for generating a fast worst-case real-time eye diagram from an input signal. The IRTO may include signal conditioning circuitry, a digitizer, an acquisition memory, a clock and data recovery ("CDR") module, a worst-case real-time eye diagram rendering ("WRTER") module, and a display.

In an example of operation, the IRTO digitizes a received input signal to produce a digitized waveform, stores the digitized waveform, detects a plurality of transitions in the digitized waveform, determines a plurality of waveform segments, and determines a plurality of recovered clocks for the digitized waveform. The IRTO then determines the worst-case waveform segments from the plurality of transitions and plurality of recovered clocks and displays the worst-case waveform segments on the display.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 1 is a plot of an example of an input signal sampled by a known real-time oscilloscope.

FIGS. 2A through 2D are four plots of voltage versus time for four example digital signals that are three time periods long and vary in amplitude between a low Voltage $V_L$ and high voltage $V_H$.

FIG. 2E is a plot of voltage versus time known as an eye diagram made by superimposing on each other the four patterns of FIGS. 2A through 2D.

FIG. 4A is a plot of voltage versus time of an example acquired waveform of an input signal received by a known real-time oscilloscope.

FIG. 4B is segmentation of the waveform shown in the plot of FIG. 4A.

FIG. 4C is overlay view of the segments of shown in FIG. 4B overplayed on each other to produce an eye diagram

FIG. 6A is a plot of voltage versus time for an example of a rising transition of part of the digitized waveform in accordance with the invention.

FIG. 6B is a plot of voltage versus time for an example of a failing transition of part of the digitized waveform in accordance with the invention.

FIG. 8A is a simplified plot of voltage versus time for the example of the implementation of the fast worst-case real-time eye diagram shown in FIG. 7 in accordance with the invention.

FIG. 8B is a plot of a distribution of time values related to the plot of FIG. 8A in accordance with the invention.

DETAILED DESCRIPTION OF THE INVENTION

Figure 3:
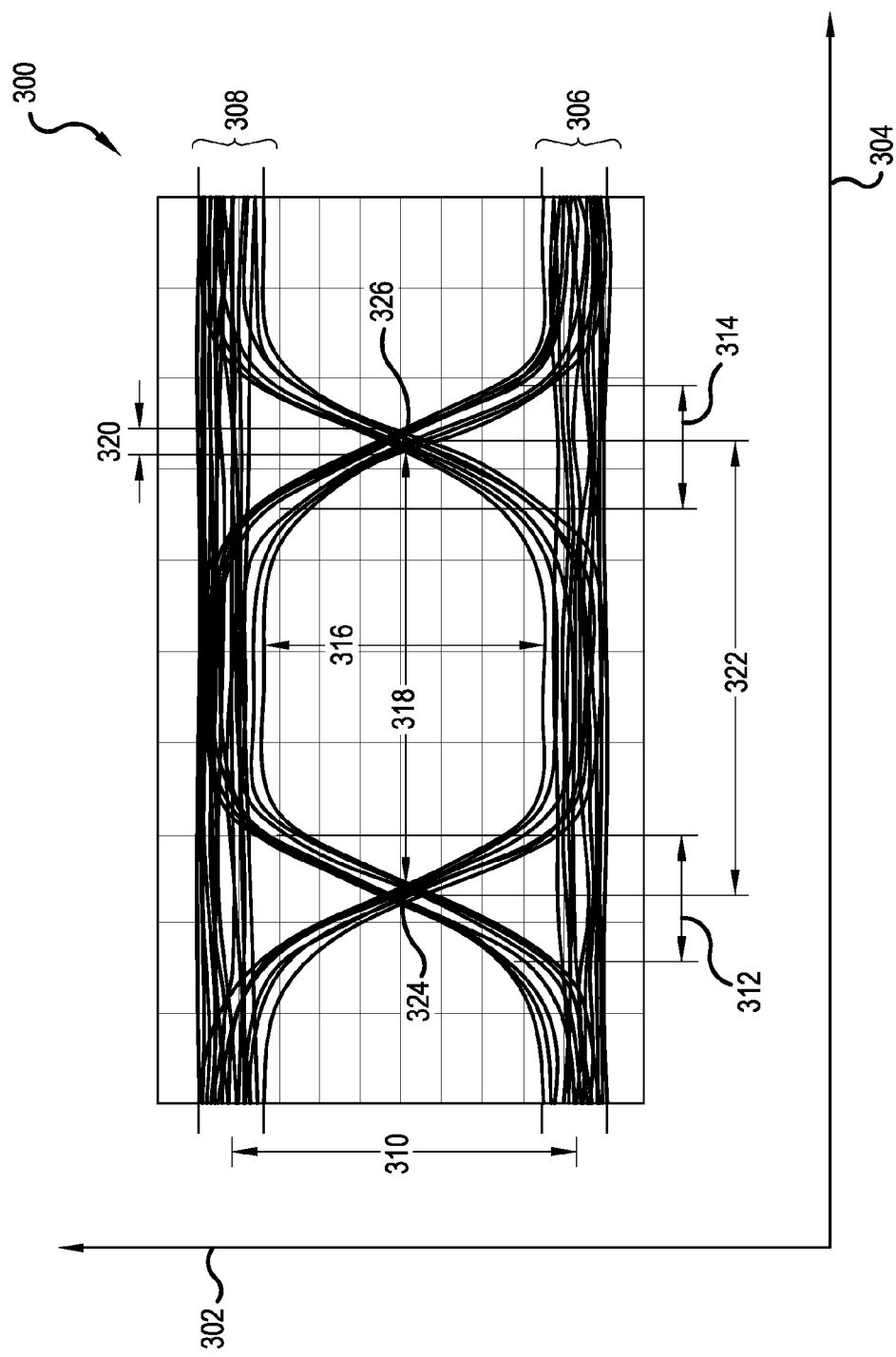
FIG. 3 is a plot of an eye diagram of voltage versus time.
Figure 5:
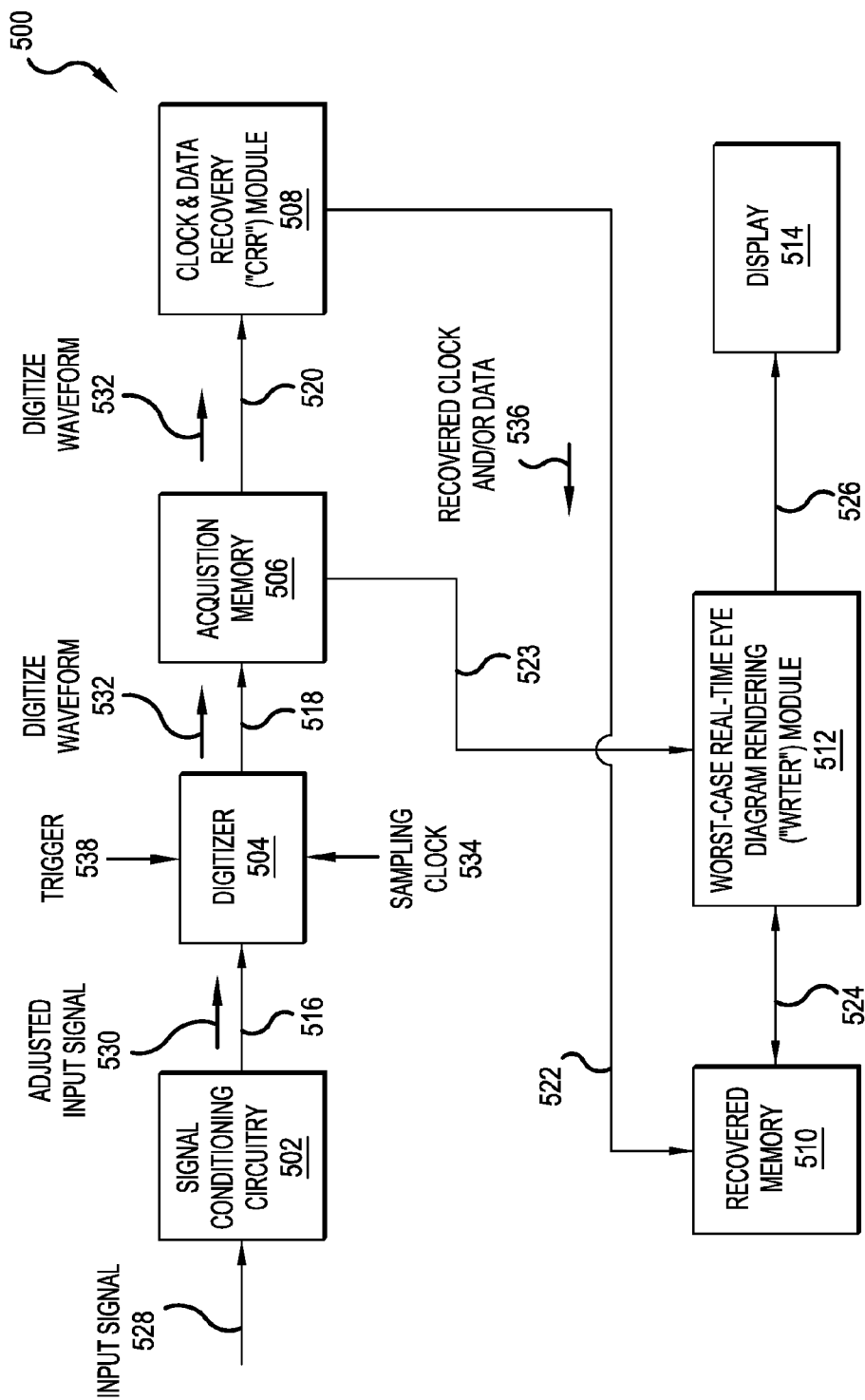
FIG. 5 is a block diagram of an example of an implementation of an improved real-time oscilloscope ("IRTO") that is capable of generating a fast worst-case real-time eye diagram from a received input signal in accordance with the invention.

In FIG. 5, a block diagram of an example of an implementation of an improved real-time oscilloscope ("IRTO") 500 that is capable of generating a fast worst-case real-time eye diagram from a received input signal is disclosed in accordance with the invention. The IRTO 500 may include signal conditioning circuitry 502, a digitizer 504, acquisition memory 506, clock and data recovery ("CDR") module 508, recovered memory 510, worst-case real-time eye diagram rendering ("WRTER") module 512, and a display 514.

In this example, the digitizer 504 may be in signal communication with the signal conditioning circuitry 502 and acquisition memory 506 via signal paths 516 and 518, respectfully. The CDR module 508 may be in signal communication with the acquisition memory 506 and recovered memory 510 via signal paths 520 and 522, respectfully. The WRTER module 512 may be in signal communication with the acquisition memory 506, recovered memory 510, display 514 via signal paths 523, 524 and 526, respectfully.

The signal conditioning circuitry 502 may include modules, components, and circuits such as, for example, amplifiers and filters, that are capable of receiving an input signal 528 and processing it so as to produce an adjusted input signal 530 that is in a format that is compatible with the digitizer 504. The digitizer 504 is a device capable of receiving the adjusted input signal 530 and, in response, produce a digitized waveform 532 that is passed to the acquisition memory 506. In general, the digitizer 504 may include an analog-to-digital converter ("ADC") (not shown) that samples the adjusted input signal 530 with a sampling clock signal 534 to produce the digitized waveform 532. The acquisition memory 506 is a storage memory for storing the digitized waveform 532.

The CDR module 508 is a device, component, or module (either in hardware, software, or both) that is capable of accessing the acquisition memory 506, to receive the digitized waveform 532, and, in response, recover a recovered clock (or a plurality of recovered clocks) and/or data 536 of the digitized waveform 530. In general, the CDR module 508 may include hardware such as, for example, digital signal processors ("DSP"), application specific integrated circuits ("ASICs"), field-programmable gate arrays ("FPGAs") or other hardware that includes edge detection hardware such, for example, as phase locked loops, threshold detectors, etc. Alternatively, or in combination, the CDR module 508 may either include, or be part of, a processor, or other programmable device, capable of running software, where the software is capable of detecting transitions in the digitized waveform 532 and recover a plurality of recovered clocks from the digitized waveform 532.

The recovered clocks include ideal times at which to sample the data or measure jitter and the recovered data includes recovered bits (i.e., a digital ONE or digital ZERO value) from the digitized waveform 532. The CDR module 508 may be configured to pass the recovered clock and/or data information 536 to the recovered memory 510, where the recovered memory 506 is a memory of storage device capable of storing information provided by the CDR module 508 via the recovered clock and/or data information signal 536. The recovered memory 510 may be a standalone memory or part of another memory unit such as the acquisition memory 506, memory (not shown) within the CDR module 508, memory (not shown) within the WRTER module 510, or other shared memory unit.

The WRTER module 512 is a device, component, or module that may be implemented in hardware, software, or both that receives the recovered clock and/or data information signal 536 and utilizes it to select the worst-case bits in the digitized waveform 530 and send them to the display 514 to display the fast worst-case real-time eye diagram.

It is appreciated by those skilled in the art that the circuits, components, modules, and/or devices of, or associated with, the IRTO 500 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

As an example of operation, in generating the fast worst-case real-time eye diagram, the IRTO 500 may perform a method that includes receiving the input signal 528 and determining the worst-case waveform segments of the digitized waveform 532 and displaying them on the display 514 in the form of a real-time eye diagram. The number of worst-case waveform segments displayed on the display 514 may be as few as two and as many as desired by either the manufacturer or a user of the IRTO 500. As an example, the number of worst-case waveform segments displayed on the display 514 may be preprogrammed by the manufacturer of the IRTO 500 or the number may be selected by the user of the IRTO 500.

In operation, the IRTO 500 performs a method that includes receiving the input signal 528 and digitizing the received input signal 528 to produce the digitized waveform 530 with the digitizer 504 and a sampling clock 534. Generally, the input signal 528 is a voltage signal that varies with time and has an input voltage amplitude range. In general, the input signal 528 carries digital information and the variations in voltage of the input signal 528 represent a digital ONE value or digital ZERO value of the data in the input signal 528.

In this example, the IRTO 500 receives the input signal 528 at an IRTO front-end, which includes the signal conditioning circuitry 502, and processes the input signal 528 to produce the adjusted input signal 530 so that it may be in a format compatible with the digitizer 504. Once the adjusted input signal 530 is received by the digitizer 504, the digitizer 504 begins sampling the adjusted input signal 530 by using a trigger signal 538 that establishes a time-zero reference for the sampling. The digitizer 504 then samples the adjusted input signal 530 at a sampling rate that produces the digitized waveform 532 having a plurality of sample points (also known as "samples") where each sample point of the plurality of sample points includes a sample point voltage. It is appreciated that the number of sample points in the digitized waveform 532 is determined by the sampling rate and that the time difference between the first time value of a first sample point and a second time value of an adjacent sample point is equal to a sampling period of the sampling clock 534. It is also appreciated that the digitized waveform 532 includes a waveform voltage amplitude range that is proportional to the input voltage amplitude range.

The IRTO 500 then stores the digitized waveform 532 in the acquisition memory 506, which may store the sample points of the digitized waveform 532 as an array of time values with corresponding sample point voltages.

The CDR module 508 then receives the digitized waveform 532 from the acquisition memory 506 and then detects a plurality of transitions in the digitized waveform 532 based on at least a first predetermined transition voltage threshold level. Where the first predetermined transition voltage threshold level may be a threshold level that is preprogrammed within the IRTO 500 or may be provided externally from the IRTO 500 such as, for example, an IRTO 500 user provided threshold. In general, the transitions in the digitized waveform 532 are edges that signify a chance in the digital value of the digitized waveform 532 such as, for example, a change from a digital ONE value to a digital ZERO value or the change from a digital ZERO value to a digital ONE value. In the case of a transition from a digital ZERO value to a digital ONE value, that transition is referred to herein as a rising edge transition. Similarly, a transition from a digital ONE value to a digital ZERO value is herein referred to as a failing edge transition. Generally, while a single threshold may be enough to detect some transitions in the input signal 528 from one logical state to another (i.e., a change in digital ONE and ZERO values), it may not be enough to detect other transitions accurately because of noise, jitter, and other errors. As such, it is typically better to use multiple thresholds to detect if a suspected transition is an actual transition and to determine if the transition is a rising edge or failing edge transition. Therefore, the CDR module 508 may utilize two or more thresholds to determine if a suspected transition in the digitized waveform 532 is a rising edge transition or a failing edge transition.

As an example, the CDR module 508 may determine the plurality of transitions in the digitized waveform 532 by determining a plurality of first threshold crossings and a plurality of second threshold crossings, where each first threshold crossing and each second threshold crossing corresponds to a transition of the plurality of transitions. In this example, the first threshold crossing may be at a first threshold voltage while the second threshold crossing may be at a second threshold voltage. Since the digitized waveform 532 includes a waveform voltage amplitude range that has a maximum value that corresponds to a digital ONE value and a minimum value that corresponds to a digital ZERO value, the first threshold voltage value and second threshold voltage value may be chosen to be percentages of the waveform voltage amplitude range. As an example, the first threshold voltage value may be selected as 80% of the maximum value of the waveform voltage amplitude range, while the second threshold voltage value may be selected as 20% of the maximum value of the waveform voltage amplitude range. Alternatively, the first threshold voltage value may be selected as 90% of the maximum value of the waveform voltage amplitude range, while the second threshold voltage value may be selected as 10% of the maximum value of the waveform voltage amplitude range. In general, if only two threshold voltages are utilized, the first threshold voltage may be above 50% of the maximum value of the waveform voltage amplitude range, while the second threshold voltage value may be selected as below 50% of the maximum value of the waveform voltage amplitude range.

If a third threshold is utilized, the accuracy of properly detecting a transition will increase as will determining whether the detected transition is rising edge transition, a failing edge transition, rising quickly edge transition, failing quickly edge transition, distorted edge, etc. As an example, if a third threshold is utilized, the third threshold voltage may be set to 50% of the maximum value of the waveform voltage amplitude range such that the first threshold voltage value may be set to any value greater than 50% of the maximum value of the waveform voltage amplitude range, while the second threshold voltage value may be set to any value less than 50% of the maximum value of the waveform voltage amplitude range. Using this method, the CDR module 508 may utilize each first threshold crossing, second threshold crossing, and third threshold crossing to detect a rising edge transition, while utilizing a fourth threshold crossing, fifth threshold crossing, and sixth threshold crossing to detect a failing edge transition. In this example, the fourth threshold crossing may correspond to the first threshold voltage value, the fifth threshold crossing may correspond to the second threshold voltage value, and the sixth threshold crossing may correspond to the third threshold voltage value. In this example, the first threshold crossing and fourth threshold crossing would correspond to the first threshold voltage value, the second threshold crossing and fifth threshold crossing would correspond to the second threshold voltage value, and the third threshold crossing and sixth threshold crossing would correspond to the third threshold voltage value.

Based on the plurality of detected transitions, the CDR module 508 may determine a plurality of waveform segments of the digitized waveform 532, a total number of transitions and waveform segments in the plurality of transitions and waveforms, respectively, and a bit period (also known as a "unit interval") for the digitized waveform 532 and waveform segments. In this case, each waveform segment would correspond to a detected transition. The CDR module 508 may then recover a plurality of recovered clock values from the digitized waveform 532, where each recovered clock value corresponds to a detected transition and waveform segment from the plurality of detected transitions and waveform segments. The CDR module 508 may also determine the voltage value of the plurality of waveform segments at their respective recovered clock values. It is appreciated that these determinations may be performed by the CDR module 508, WRTER module 512, or in combination with both.

The information generated by the CDR module 508 may then be stored in the recovered memory 510. This information may include plurality of transitions and a plurality of waveform segments in the digitized waveform 532, the total number of transitions, time values of the threshold crossings of the transitions, voltage values of waveform segments at their respective recovered clock value, the bit period of the digitized waveform 532 and waveform segments, and plurality of recovered clock values.

The WRTER module 512 receives the recovered clock and/or data signal 536 or accesses the data from the recovered memory 510. The WRTER module 512 may also receive acquisition data (such as the digitized waveform 532) from the acquisition memory 506. In general, the WRTER module 512 determines the worst-case waveform segments from the plurality of waveform segments that show most derogation of the eye diagram, i.e., the waveform segments that most cause the eye diagram to "close" in on itself. The WRTER module 512 determines the worst-case waveform segments by comparing the time values of each threshold crossing versus its respective recovered clock, for each transition, to produce a plurality of time differences for each threshold crossing. The minimum time difference corresponding to a given threshold crossing of the plurality of specific threshold crossings (for example, the plurality of first threshold crossings) represents the threshold crossing that is closest to its recovered clock. This means that it has the greatest effect, for that given threshold crossing (such as, for example, the first threshold crossing), to close the eye diagram in the horizontal dimension. The WRTER module 512 then selects the worst-case waveform segment that corresponds to the threshold crossing with the minimum time difference and sends it to the display 514 for displaying. The WRTER module 512 preforms this method for every threshold crossing determined by the CDR module 508, which in this example may vary from at least two threshold crossings to six threshold crossings.

In the example case of six threshold crossings, the WRTER module 512 may first determine: 1) a plurality of first time difference values from the plurality of first threshold crossings and the plurality of recovered clocks, where each first time difference value corresponds to a first time difference between a first threshold crossing, of a transition of the plurality of transitions, and a recovered clock corresponding to that transition; 2) a plurality of second time difference values from the plurality of second threshold crossings and the plurality of recovered clocks, where each second time difference value corresponds to a second time difference between a second threshold crossing, of a transition of the plurality of transitions, and a recovered clock corresponding to that transition; 3) a plurality of third time difference values from the plurality of third threshold crossings and the plurality of recovered clocks, where each third time difference value corresponds to a third time difference between a third threshold crossing, of a transition of the plurality of transitions, and a recovered clock corresponding to that transition; 4) a plurality of fourth time difference values from the plurality of fourth threshold crossings and the plurality of recovered clocks, where each fourth time difference value corresponds to a fourth time difference between a fourth threshold crossing, of a transition of the plurality of transitions, and a recovered clock corresponding to that transition; 5) a plurality of fifth time difference values from the plurality of fifth threshold crossings and the plurality of recovered clocks, where each fifth time difference value corresponds to a fifth time difference between a fifth threshold crossing, of a transition of the plurality of transitions, and a recovered clock corresponding to that transition; and 6) a plurality of sixth time difference values from the plurality of sixth threshold crossings and the plurality of recovered clocks, where each sixth time difference value corresponds to a sixth time difference between a sixth threshold crossing, of a transition of the plurality of transitions, and a recovered clock corresponding to that transition. The WRTER module 512 may then determine: 1) a first worst-case time difference value from the plurality of first time difference values, where the first worst-case time difference corresponds to a first worst-case waveform segment of the plurality of waveform segments; 2) a second worst-case time difference value from the plurality of second time difference values, where the second worst-case time difference corresponds to a second worst-case waveform segment of the plurality of waveform segments; 3) a third worst-case time difference value from the plurality of third time difference values, where the third worst-case time difference corresponds to a third worst-case waveform segment of the plurality of waveform segments; 4) a fourth worst-case time difference value from the plurality of fourth time difference values, where the fourth worst-case time difference corresponds to a fourth worst-case waveform segment of the plurality of waveform segments; 5) a fifth worst-case time difference value from the plurality of fifth time difference values, where the fifth worst-case time difference corresponds to a fifth worst-case waveform segment of the plurality of waveform segments; and 6) a sixth worst-case time difference value from the plurality of sixth time difference values, where the sixth worst-case time difference corresponds to a sixth worst-case waveform segment of the plurality of waveform segments.

With these six worst-case waveform segments, the IRTO 500 may display a fast worst-case real-time eye diagram on the display 514 that includes these six worst-case waveform segments. These six worst-case waveform segments would allow the IRTO 500 to quickly display a real-time eye that a user could use to determine the worst-case signal characteristics. However, these six worst-case waveform segments would not show how the eye diagram closed in the vertical dimension.

In order to show how the eye closes in the vertical direction, the WRTER module 512 may determine: a plurality of voltage logic ONE values from the plurality of waveform segments, where each voltage logic ONE value corresponds to a voltage of a waveform segment, of the plurality of waveform segments, at a time value corresponding to the recovered clock that corresponds to the waveform segment; and determine a plurality of voltage logic ZERO values from the plurality of waveform segments, wherein each voltage logic ZERO value corresponds to a voltage of a waveform segment, of the plurality of waveform segments, at a time value corresponding to the recovered clock that corresponds to the waveform segment; determine a lowest voltage logic ONE value from the plurality of voltage logic ONE values, wherein the lowest voltage logic ONE value corresponds to a seventh worst-case waveform segment of the plurality of waveform segments; and determine a highest logic ZERO value from the plurality of voltage logic ZERO values, wherein the highest logic ZERO value corresponds to an eighth worst-case waveform segment of the plurality of waveform segments. With these two additional waveform segments (i.e., the seventh worst-case waveform segment and eighth worst-case waveform segment), the resulting fast worst-case real-time eye diagram produced by the display 514 would also show how the worst-case bits effect (i.e., close) the vertical dimension of the eye diagram. This process is shown graphically in FIGS. 6A and 6B and 7.

It is appreciated that in the above described examples, the IRTO 500 would produce fast worst-case real-time eye diagrams that would be the result of from two to eight waveform segments that conveyed the worst bits in the waveform. However, some users may want to see an eye diagram displayed on the display 514 that is more conventional and shows hundreds if not thousands of waveform segment traces on the display 514. As such, the IRTO may also display hundreds or thousands of additional waveform segments that are similar to the worst-case waveform segments to more populate the display 514 with additional traces when displaying the fast worst-case real-time eye diagram.

As a further example, the WRTER module 512 may be configured to determine: a first thousand waveform segments that have first time difference values that are approximately equal to the first worst-case time difference value; a second thousand waveform segments that have second time difference values that are approximately equal to the second worst-case time difference value; a third thousand waveform segments that have third time difference values that are approximately equal to the third worst-case time difference value; a fourth thousand waveform segments that have fourth time difference values that are approximately equal to the fourth worst-case time difference value, a fifth thousand waveform segments that have fifth time difference values that are approximately equal to the fifth worst-case time difference value; a sixth thousand waveform segments that have sixth time difference values that are approximately equal to the sixth worst-case time difference value; and a seventh thousand waveform segments that have either the minimum ONE value or maximum ZERO value at the recovered clock time. In this example, the IRTO 500 may display 7,008 waveform segments on the display 514 to better suit the preferences of a user. It is appreciated that 7,008 is only an example and that any number of additional waveform segments could be utilized.

Turning to FIG. 6A, a plot 600 of voltage 602 versus time 604 for an example of a transition 606 of part of the digitized waveform 608 is shown. The transition 606 is shown to be a rising edge transition with three threshold crossing 610, 612, and 614. The transition 606 crosses the first threshold voltage value 616 at the first threshold crossing 610. As mentioned earlier, the first threshold voltage value 616 may be a threshold value set to above 50% (such as, for example, 80%) of the voltage amplitude range of the digitized waveform 608. The transition 606 crosses the second threshold voltage value 618 at the second threshold crossing 612. The second threshold voltage value 618 may be a set to a threshold value below 50% (such as, for example, 20%) of the voltage amplitude range of the digitized waveform 608. Similarly, the transition 606 crosses the third threshold voltage value 620 at the third threshold crossing 614. The third threshold voltage value 620 may be a set to a threshold value of 50% of the voltage amplitude range of the digitized waveform 608. These three threshold values may be pre-programmed or externally provided by a user of the IRTO 500.

From this example, the rising edge transition 606 has a time $t_1$ 622 at the first threshold crossing 610 corresponding to the first threshold voltage value 616, time $t_2$ 624 at the second threshold crossing 612 corresponding to the second threshold voltage value 618, and time $t_3$ 626 at the third threshold crossing 614 corresponding to the third threshold voltage value 620.

Similarly in FIG. 6B, a plot 628 of voltage 602 versus time 604 for an example of another transition 630 of part of the digitized waveform 608 is shown. The transition 630 is shown to be a failing edge transition with three threshold crossing 632, 634, and 636. The transition 630 crosses the first threshold voltage value 616 at the fourth threshold crossing 632. The transition 630 crosses the second threshold voltage value 618 at the fifth threshold crossing 634. Similarly, the transition 630 crosses the third threshold voltage value 620 at the sixth threshold crossing 636. Again, these three threshold values may be pre-programmed or externally provided by a user of the IRTO 500 and have the same values shown in FIG. 6A.

From this example, the failing edge transition 630 has a time $t_4$ 638 at the fourth threshold crossing 632 corresponding to the first threshold voltage value 616, time $t_5$ 640 at the second threshold crossing 634 corresponding to the second threshold voltage value 618, and time $t_6$ 642 at the sixth threshold crossing 636 corresponding to the third threshold voltage value 620.

Figure 7:
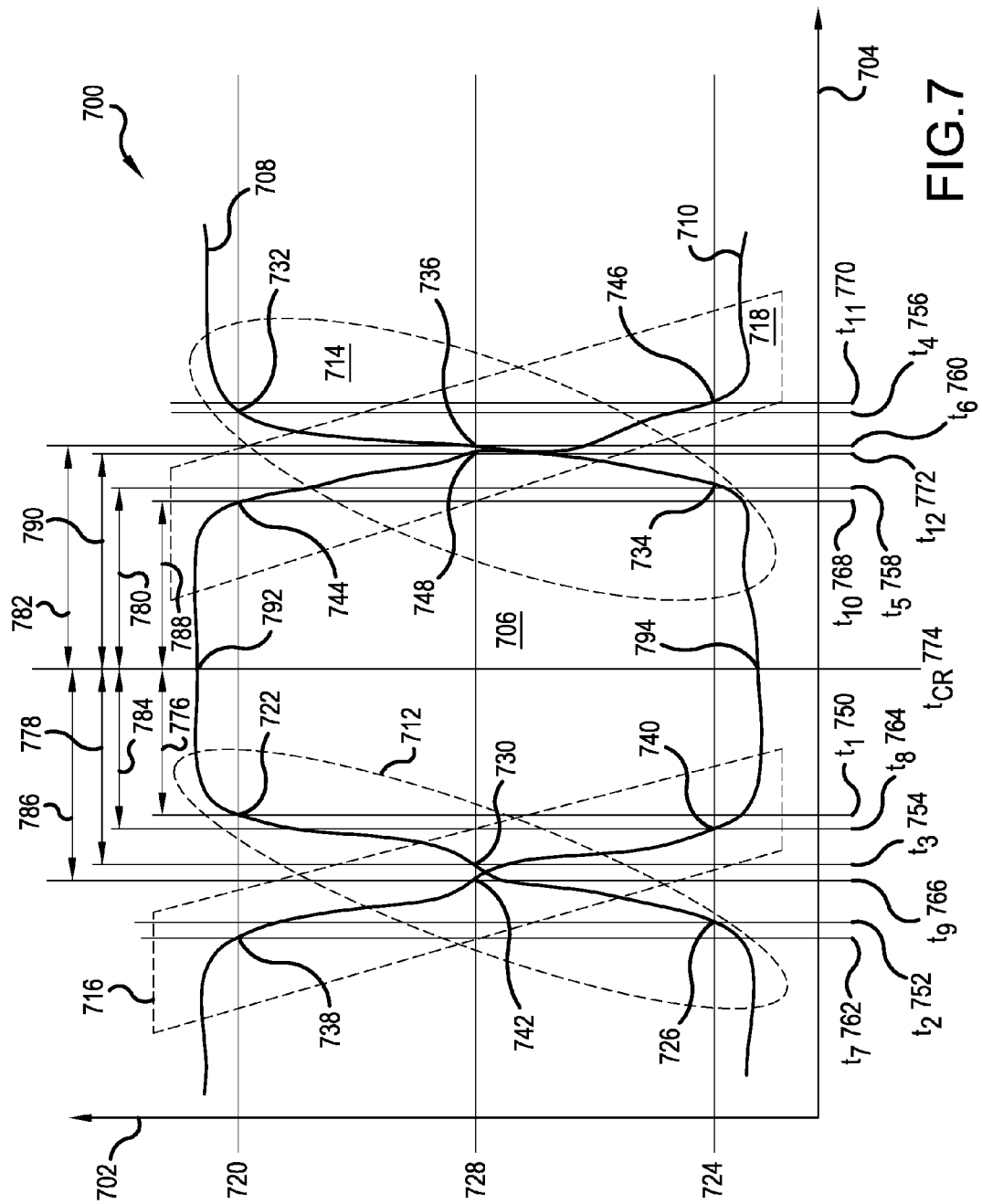
FIG. 7 is a plot of voltage versus time for an example of an implementation of a real-time worst-case eye diagram in according to the present invention.

In FIG. 7, a plot 700 of voltage 702 versus time 704 for an example of an implementation of a fast worst-case real-time eye diagram 706 according to the present invention is shown. In this example, the fast worst-case real-time eye diagram 706 is formed by at least two worst-case waveform segments 708 and 710. The two worst-case waveform segments 708 and 710 include two rising edge transitions 712 and 714 and two failing edge transitions 716 and 718. The first rising edge transition 712 crosses a first threshold voltage value 720 at the first threshold crossing 722, a second threshold voltage value 724 at the second threshold crossing 726, and the third threshold voltage value 728 at the third threshold crossing 730. The second rising edge transition 714 crosses the first threshold voltage value 720 at the fourth threshold crossing 732, the second threshold voltage value 724 at the fifth threshold crossing 734, and the third threshold voltage value 728 at the sixth threshold crossing 736. The first failing edge transition 716 crosses the first threshold voltage value 720 at the seventh threshold crossing 738, the second threshold voltage value 724 at the eighth threshold crossing 740, and the third threshold voltage value 728 at the ninth threshold crossing 742. The second failing edge transition 718 crosses the first threshold voltage value 720 at the tenth threshold crossing 744, the second threshold voltage value 724 at the eleventh threshold crossing 746, and the third threshold voltage value 728 at the twelfth threshold crossing 748.

For this example, the first rising edge transition 712 has a time $t_1$ 750 at the first threshold crossing 722 corresponding to the first threshold voltage value 720, time $t_2$ 752 at the second threshold crossing 726 corresponding to the second threshold voltage value 724, and time $t_3$ 754 at the threshold crossing 730 corresponding to the third threshold voltage value 728. The second rising edge transition 714 has a time $t_4$ 756 at the fourth threshold crossing 732 corresponding to the first threshold voltage value 720, time $t_5$ 758 at the fifth threshold crossing 734 corresponding to the second threshold voltage value 724, and time $t_6$ 760 at the sixth threshold crossing 736 corresponding to the third threshold voltage value 728. Turning to the failing edge transitions 716 and 718, the first failing edge transition 716 has a time $t_7$ 762 at the seventh threshold crossing 738 corresponding to the first threshold voltage value 720, time $t_8$ 764 at the eighth threshold crossing 740 corresponding to the second threshold voltage value 724, and time $t_9$ 766 at the ninth threshold crossing 742 corresponding to the third threshold voltage value 728. The second failing edge transition 718 has a time $t_{10}$ 768 at the tenth threshold crossing 744 corresponding to the first threshold voltage value 720, time $t_{11}$ 770 at the eleventh threshold crossing 746 corresponding to the second threshold voltage value 724, and time $t_{12}$ 772 at the twelfth threshold crossing 748 corresponding to the third threshold voltage value 728.

Using these measured time values, the worst-case time from each threshold crossing that effects the fast worst-case real-time eye diagram 706 opening (i.e., 722, 726, 732, 736, 738, 742, 744, and 746) to its recovered clock time value $t_{CR}$ 774 may be determined. To find the worst-case time in this example, the WRTER module 512 takes the difference of each threshold crossing time value versus the recovered clock time value $t_{CR}$ 774 to determine if the edge of a transition is encroaching on the clock time value $t_{CR}$ 774, which effectively "closes" the fast worst-case real-time eye diagram 706 horizontally. Specifically, in the first rising edge transition 712, the WRTER module 512 calculates, for example, a first time difference 776 between time $t_1$ 750 and the clock time value $t_{CR}$ 774 and a second time difference 778 between time $t_3$ 754 and the clock time value $t_{CR}$ 774. For the second rising edge transition 714, the WRTER module 512 calculates, for example, a third time difference 780 between time $t_5$ 758 and the clock time value $t_{CR}$ 774 and a fourth time difference 782 between time $t_6$ 760 and the clock time value $t_{CR}$ 774. For the first failing edge transition 716, the WRTER module 512 calculates, for example, a fifth time difference 784 between time $t_8$ 764 and the clock time value $t_{CR}$ 774 and a sixth time difference 786 between time $t_9$ 766 and the clock time value $t_{CR}$ 774. For the second failing edge transition 718, the WRTER module 512 calculates, for example, a seventh time difference 788 between time $t_{10}$ 768 and the clock time value $t_{CR}$ 774 and an eighth time difference 790 between time $t_{12}$ 772 and the clock time value $t_{CR}$ 774.

It is appreciated that in this example only two waveforms segments 708 and 710 have been shown for simplicity. The WRTER module 512 would repeat this process for every transition in the digitized waveform 532 creating an array of time difference values for every transition based on the number of thresholds utilized in determining the edge of the transition. In this example, the WRTER module 512 would send six to eight worst-case waveform segments to the display to be displayed in forming the fast worst-case real-time eye diagram 706. In this example, the sixth time difference 786 may be compared against the second time difference 778, if the sixth time difference 786 is less than the second time difference 778, then the WRTER module 512 may choose to only use the sixth time difference 786 because it represents a worse-case waveform segment than the second time difference 778. Alternatively, if the sixth time difference 786 is greater than the second time difference 778, then the WRTER module 512 may choose to only use the second time difference 778 because it represents a worse-case waveform segment than the sixth time difference 776. Similarly, the eighth time difference 790 may be compared to the fourth time difference 782 and if the eighth time difference 790 is less than the fourth time difference 782, then the WRTER module 512 may choose to only use the eighth time difference 790. If, instead, the eighth time difference 790 is greater than the fourth time difference 782, then the WRTER module 512 may choose to only use the fourth time difference 782.

It is also appreciated that the worst-case waveform segments (i.e., bits) will typically encroach on their corresponding recovered clocks causing detection errors and consequently "closing" the fast worst-case real-time eye diagram 706. From the time difference values, it can be determined which bits are starting to encroach on other bits. For example, if time difference 776 is small it means that first threshold crossing 722 of the rising edge transition 712 is close to the recovered clock time value $t_{CR}$ 774 and may cause bit errors.

In this example, the WRTER module 512 may determine six minimum values of the time difference values corresponding to the minimum time difference values 776 and 788 for the first threshold voltage value 720, minimum time difference values 780 and 784 for the second threshold voltage value 724, the minimum of the minimum time difference values 778 and 786 for the third threshold voltage value 728, and minimum of the minimum time difference values 782 and 790 for the third threshold voltage value 728. The reason that second threshold crossing 726, fourth threshold crossing 732, seventh threshold crossing 738, and eleventh threshold crossing 746 are being excluded from this procedure is because these threshold crossings do not affect the fast worst-case real-time eye diagram 706 because they are not located within the opening of fast worst-case real-time eye diagram 706.

Once the six minimum values (i.e., the worst-case time difference values) of the time difference values have been determined, the WRTER module 512 then determines which transitions and corresponding worst-case waveform segments produced the six minimum values. These worst-case waveform segments are then sent to the display 514 to display the fast worst-case real-time eye diagram 706. With these six worst-case time difference values, the IRTO 500 is able to display the worst-case waveform segments that show how the fast worst-case real-time eye diagram 706 "closes" in the horizontal dimension.

Additionally, as mention earlier, the WRTER module 512 may also determine the lowest voltage logic ONE value 792 and the highest logic ZERO value 794 for the transitions by determining the minimum and maximum values of the actual voltage values of the waveform segments at the recovered clock time value $t_{CR}$ 774 for the first and second waveforms 708 and 710, respectively. These values would correspond to the seventh and eighth worst-case waveform segments which may be sent by the WRTER module 512 to the display 514. With these additional values determined, the seventh and eighth worst-case waveform segments would show which acquired waveforms have the most effect in closing the fast worst-case real-time eye diagram 706 in the vertical dimension.

It is appreciated that while only six waveforms (or eight waveforms to have both horizontal and vertical eye closure characteristics) are needed to generate a fast worst-case real-time eye diagram 706 as described above, most oscilloscope users prefer to see more waveforms plotted on the display 514 of an oscilloscope. As such, the WRTER module 512 may determine a number of other waveforms that are near the six, or eight, selected waveforms to populate the display 514 for a user to see when utilizing the IRTO 500. As described earlier, the number of other waveforms used may be pre-programmable or user selected and may vary into the thousands. Again, it is appreciated that in the above described examples, the IRTO 500 would produce fast worst-case real-time eye diagrams that would be the result of from two to eight waveform segments that conveyed the worst bits in the waveform. However, some users may want to see an eye diagram displayed on the display 514 that is more conventional and shows hundreds if not thousands of waveform segment traces on the display 514. As such, the IRTO may also display hundreds or thousands of additional waveform segments that are similar to the worst-case waveform segments to more populate the display 514 with additional traces when displaying the fast worst-case real-time eye diagram.

As an example, 7,000 additional waveforms may be selected to be displayed with the six or eight originally selected waveforms (i.e., eight if the waveforms that were selected by determining the minimum time differences and minimum ONE value and maximum ZERO values described above are utilized). In this example, similar to the example discussed in association to FIG. 5, the IRTO 500 may display 7,008 waveform segments on the display 514 to better suit the preferences of a user. Again, it is appreciated that 7,008 is only an example and that any number of additional waveform segments could be utilized.

Turning to FIG. 8A, a simplified plot 800 of voltage 802 versus time 804 for the example of the implementation of the fast worst-case real-time eye diagram 806 is shown. In this simplified plot 800, the eight worst-case waveform segments 808, 810, 812, 814, 816, 818, 820, and 822 are shown without distortion for illustration purposes that allow the threshold crossings to be seen. In this simplified plot 800, the eight worst-case waveform segments 808, 810, 812, 814, 816, 818, 820, and 822 are shown as traces that overlap where the first four worst-case waveform segments 808, 812, 816, and 820 are shown on the first overlaid trace and the second four worst-case waveform segments 810, 814, 818, and 822 are shown on the second overlaid trace.

In this example, the first worst-case waveform segment 808 would correspond to the first threshold crossing 824, at a first threshold voltage value 826, of the rising edge transition of the first worst-case waveform segment 808. The second worst-case waveform segment 810 would correspond to the second threshold crossing 828, at a second threshold voltage value 830, of the failing edge transition of the second worst-case waveform segment 810. The third worst-case waveform segment 812 would correspond to the third threshold crossing 832, at a third threshold voltage value 834, of the rising edge transition of the third worst-case waveform segment 812. The fourth worst-case waveform segment 814 would correspond to the fourth threshold crossing 836, at the second threshold voltage value 830, of the rising edge transition of the fourth worst-case waveform segment 814. The fifth worst-case waveform segment 816 would correspond to the fifth threshold crossing 838, at the first threshold voltage value 826, of the failing edge transition of the fifth worst-case waveform segment 816. The sixth worst-case waveform segment 816 would correspond to the sixth threshold crossing 840, at the third threshold voltage value 834, of the failing edge transition of the sixth worst-case waveform segment 816. The seventh worst-case waveform segment 818 would correspond to the maximum ZERO value 842, at the recovered clock time $t_{CR}$ 844, of the seventh worst-case waveform segment 818. Finally, the eighth worst-case waveform segment 820 would correspond to the minimum ONE value 846, at the recovered clock time $t_{CR}$ 844, of the eighth worst-case waveform segment 820. In this example, the first threshold crossing 824 would be at a first time $t_1$ 850, second threshold crossing 828 would be at a second time $t_2$ 852, third threshold crossing 832 would be at a third time $t_3$ 854, fourth threshold crossing 836 would be at a fourth time $t_4$ 856, fifth threshold crossing 838 would be at a fifth time $t_5$ 858, and sixth threshold crossing 840 would be at a sixth time $t_6$ 860.

As discussed earlier, the first through sixth threshold crossings 824, 828, 832, 836, 838, and 840 would be the worst-case thresholds that result in worst-case waveform segments 808, 810, 812, 814, 816, and 818 that represent the bits of the digitized waveform that most cause the fast worst-case real-time eye diagram 806 to "close" in the horizontal dimension 848. As such, the waveform segments corresponding to the other threshold crossings 862, 864, 866, 868, 870, and 872 are not used in displaying the fast worst-case real-time eye diagram 806. Since the maximum ZERO value 842 and minimum ONE value 846 represent the bits of the digitized waveform that most cause the fast worst-case real-time eye diagram 806 to "close" in the vertical dimension 874, the seventh and eighth worst-case waveform segments 818 and 820 corresponding to maximum ZERO value 842 and minimum ONE value 846, respectively, are also utilized.

In FIG. 8B, a plot 876 of a distribution of time 804 values related to plot 800 of FIG. 8A is shown. The distributions of time 878, 880, 882, 884, 886, 888, and 890 are threshold values for other waveform segments that are close to the threshold values 832, 828, 824, 842 (and 846), 838, 836, and 840, respectively. In other words, the threshold values 832, 828, 824, 842 (and 846), 838, 836, and 840 represent the worst bits of the digitized waveform so the distributions of time 878, 880, 882, 884, 886, 888, and 890 represent regions around these worst-case bits that may be used to visually improve the look of the fast worst-case real-time eye diagram 806 for some users.

As such, these other waveform segments may be used to add additional traces to the fast worst-case real-time eye diagram 806 to give the appearance of the fast worst-case real-time eye diagram 806 a more standard real-time eye diagram look. This process has been described above and it is appreciated that based on the previous discussions the distributions of time 878, 880, 882, 884, 886, 888, and 890 may represent 1,000 threshold values each that evenly saddle the time values $t_3$ 854, $t_2$ 852, $t_1$ 850, $t_{CR}$ 844, $t_5$ 858, $t_4$ 856, and $t_6$ 860, respectively (i.e., 500 unit intervals to the left and 500 unit intervals to the right for each bit). The result is 7,000 additional waveform segments that may be plotted on the fast worst-case real-time eye diagram 806 in addition to worst-case waveform segments 810, 812, 814, 816, 818, 820, and 822 for a total of 7,008 waveform segment traces.

Figure 9:
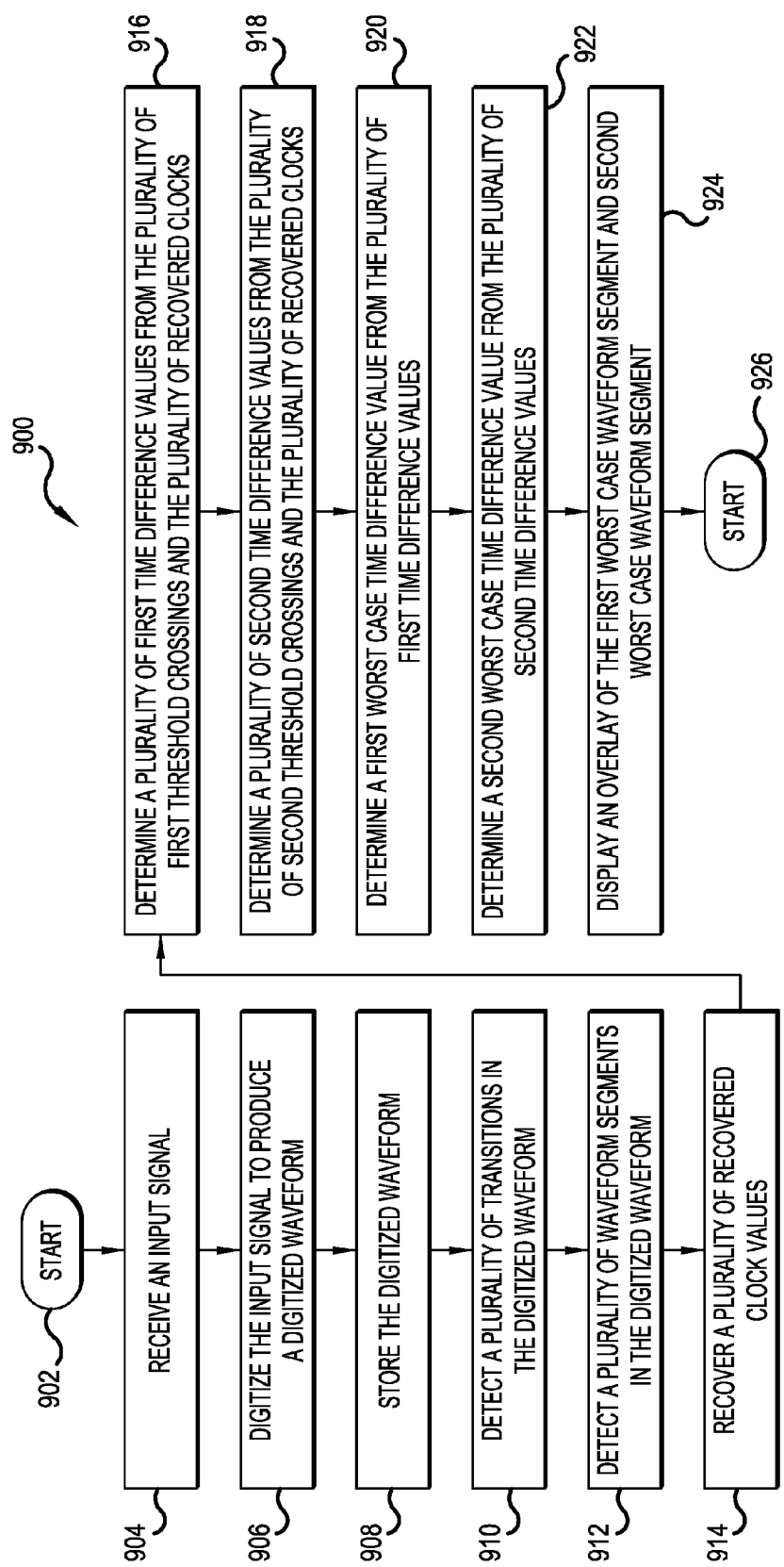
FIG. 9 is a flowchart of an example of an implementation of a process performed by the IRTO, of FIG. 5, accordance with the invention.

Turning to FIG. 9, a flowchart 900 of an example of an implementation of a process performed by the IRTO 500 is shown in accordance with the invention. The process starts 902 by receiving an input signal 904 and digitizing the input signal to produce a digitized waveform 906. The digitized signal is then stored 908 and then a plurality of transitions in the digitized waveform are detected 910. This includes determining a plurality of first threshold crossings and a plurality of second threshold crossings, where each first threshold crossing and each second threshold crossing corresponds to a transition of the plurality of transitions. The process then determines a plurality of waveform segments of the digitized waveform 912, where each waveform segment corresponds to a transition of the plurality of transitions and recovers a plurality of recovered clocks from the digitized waveform 914, where each recovered clock of the plurality of clocks corresponds to a transition of the plurality of transitions. From these values, the process then determines a plurality of first time difference values from the plurality of first threshold crossings and the plurality of recovered clocks 916, where each first time difference value corresponds to a first time difference between a first threshold crossing, of a transition of the plurality of transitions, and a recovered clock corresponding to that transition. The process then determines a plurality of second time difference values from the plurality of second threshold crossings and the plurality of recovered clocks 918, where each second time difference value corresponds to a second time difference between a second threshold crossing, of a transition of the plurality of transitions, and a recovered clock corresponding to that transition. From these values, the process determines a first worst case time difference value from the plurality of first time difference values 920, where the first worst case time difference corresponds to a first worst case waveform segment of the plurality of waveform segments; and determines a second worst case time difference value from the plurality of second time difference values 922, wherein the second worst case time difference corresponds to a second worst case waveform segment of the plurality of waveform segments. The process then displays an overlay of the first worst case waveform segment and second worst case waveform segment 924, from the plurality of waveform segments, to form the fast worst-case real-time eye diagram. The process then ends 926.

Although the previous description only illustrates particular examples of various implementations, the invention is not limited to the foregoing illustrative examples. A person skilled in the art is aware that the invention as defined by the appended claims can be applied in various further implementations and modifications. In particular, a combination of the various features of the described implementations is possible, as far as these features are not in contradiction with each other. Accordingly, the foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. An improved real-time oscilloscope ("IRTO") for generating a fast worst-case real-time eye diagram from an input signal, the IRTO comprising:
   signal conditioning circuitry, wherein the signal conditioning circuitry is configured to receive the input signal and, in response, produce an adjusted input signal;
   a digitizer in signal communication with the signal conditioning circuitry, wherein the digitizer is configured to receive the adjusted input signal and, in response, produce a digitized waveform;
   an acquisition memory in signal communication with the digitizer, wherein the acquisition memory is configured to receive and store the digitized waveform received from the digitizer;
   a clock and data recovery ("CDR") module in signal communication with the acquisition memory, wherein the CDR module is configured to
      detect a plurality of transitions in the digitized waveform,
      determine a plurality of first threshold crossings and a plurality of second threshold crossings, wherein each first threshold crossing and each second threshold crossing corresponds to a transition of the plurality of transitions,
      determine a plurality of waveform segments of the digitized waveform, wherein each waveform segment corresponds to a transition of the plurality of transitions, and
      recover a plurality of recovered clocks from the digitized waveform, wherein each recovered clock of the plurality of clocks corresponds to a transition of the plurality of transitions;
   a worst-case real-time eye diagram rendering ("WRTER") module in signal communication with CDR module, wherein the WRTER module is configured to
      determine a plurality of first time difference values from the plurality of first threshold crossings and the plurality of recovered clocks, wherein each first time difference value corresponds to a first time difference between a first threshold crossing, of a transition of the plurality of transitions, and a recovered clock corresponding to that transition,
      determine a plurality of second time difference values from the plurality of second threshold crossings and the plurality of recovered clocks, wherein each second time difference value corresponds to a second time difference between a second threshold crossing, of a transition of the plurality of transitions, and a recovered clock corresponding to that transition,
      determine a first worst-case time difference value from the plurality of first time difference values, wherein the first worst-case time difference corresponds to a first worst-case waveform segment of the plurality of waveform segments,
      determine a second worst-case time difference value from the plurality of second time difference values, wherein the second worst-case time difference corresponds to a second worst-case waveform segment of the plurality of waveform segments; and
   a display configured to display an overlay of the first worst-case waveform segment and second worst-case waveform segment, from the plurality of waveform segments, to form the fast worst-case real-time eye diagram.

2. The IRTO of claim 1,
   wherein the CDR module is configured to further determine a plurality of third threshold crossings, wherein each third threshold crossing corresponds to a transition in the plurality of transitions, and
   wherein each first threshold crossing occurs at a first threshold voltage, each second threshold crossing occurs at a second threshold voltage, and each third threshold crossing occurs at a third threshold voltage, and
   wherein the third threshold voltage is greater than the second threshold voltage and less than the first threshold voltage value.

3. The IRTO of claim 2, wherein the digitized waveform has an voltage amplitude range, wherein the first threshold voltage is equal to eighty percent of the voltage amplitude range, wherein the second threshold voltage is equal to twenty percent of the voltage amplitude range, and wherein the third threshold voltage is equal to fifty percent of the voltage amplitude range.

4. The IRTO of claim 2,
   wherein the WRTER module is configured to further
      determine a plurality of third time difference values from the plurality of third threshold crossings and the plurality of recovered clocks, wherein each third time difference value corresponds to a third time difference between a third threshold crossing, of a transition of the plurality of transitions, and a recovered clock corresponding to that transition, determine a third worst-case time difference value from the plurality of third time difference values, wherein the third worst-case time difference corresponds to a third worst-case waveform segment of the plurality of waveform segments, and wherein the display is configured to display an overlay of the first worst-case waveform segment, second worst-case waveform segment, and a third worst-case waveform segment from the plurality of waveform segments, to form the fast worst-case real-time eye diagram.

5. The IRTO of claim 4, wherein the CDR module is configured to determine a plurality of rising edge transitions and plurality of failing edge transitions, where each transition in the plurality of transitions is a rising edge transition or a failing edge transition, wherein each first threshold crossing, second threshold crossing, and third threshold crossing corresponds to a rising edge transition in the plurality of rising edge transitions, and determine a plurality of fourth threshold crossings, plurality of fifth threshold crossings, and plurality of sixth threshold crossings, wherein each fourth threshold crossing, fifth threshold crossing, and sixth threshold crossing corresponds to a failing edge transition of the plurality of failing edge transitions, and wherein each fourth threshold crossing occurs at the first threshold voltage, each fifth threshold crossing occurs at the second threshold voltage, and each sixth threshold crossing occurs at the third threshold voltage.

6. The IRTO of claim 5, wherein the WRTER is configured to determine a plurality of fourth time difference values from the plurality of fourth threshold crossings, wherein each fourth time difference value corresponds to a fourth time difference between a fourth threshold crossing, of a failing edge transition of the plurality of transitions, and a recovered clock corresponding to that failing edge transition, determine a plurality of fifth time difference values from the plurality of fifth threshold crossings and the plurality of recovered clocks, wherein each fifth time difference value corresponds to a fifth time difference between a fifth threshold crossing, of a failing edge transition of the plurality of transitions, and a recovered clock corresponding to that failing edge transition, determine a plurality of sixth time difference values from the plurality of sixth threshold crossings and the plurality of recovered clocks, wherein each sixth time difference value corresponds to a sixth time difference between a sixth threshold crossing, of a failing edge transition of the plurality of transitions, and a recovered clock corresponding to that failing edge transition, determine a fourth worst-case time difference value from the plurality of fourth time difference values, wherein the fourth worst-case time difference corresponds to a fourth worst-case waveform segment of the plurality of waveform segments, determine a fifth worst-case time difference value from the plurality of fifth time difference values, wherein the fifth worst-case time difference corresponds to a fifth worst-case waveform segment of the plurality of waveform segments, determine a sixth worst-case time difference value from the plurality of sixth time difference values, wherein the sixth worst-case time difference corresponds to a sixth worst-case waveform segment of the plurality of waveform segments, and wherein the display is configure to display an overlay of the first worst-case waveform segment, second worst-case waveform segment, third worst-case waveform segment, fourth worst-case waveform segment, fifth worst-case waveform segment, and sixth worst-case waveform segment from the plurality of waveform segments, to form the fast worst-case real-time eye diagram.

7. The IRTO of claim 6, wherein the digitized waveform has an voltage amplitude range, wherein the first threshold voltage is equal to eighty percent of the voltage amplitude range, wherein the second threshold voltage is equal to twenty percent of the voltage amplitude range, and wherein the third threshold voltage is equal to fifty percent of the voltage amplitude range.

8. The IRTO of claim 6, wherein the WRTER module is configured to determine a plurality of voltage logic ONE values from the plurality of waveform segments, wherein each voltage logic ONE value corresponds to a voltage of a waveform segment, of the plurality of waveform segments, at a time value corresponding to the recovered clock that corresponds to the waveform segment, determine a plurality of voltage logic ZERO values from the plurality of waveform segments, wherein each voltage logic ZERO value corresponds to a voltage of a waveform segment, of the plurality of waveform segments, at a time value corresponding to the recovered clock that corresponds to the waveform segment, determine a lowest voltage logic ONE value from the plurality of voltage logic ONE values, wherein the lowest voltage logic ONE value corresponds to a seventh worst-case waveform segment of the plurality of waveform segments, and determine a highest logic ZERO value from the plurality of voltage logic ZERO values, wherein the highest logic ZERO value corresponds to an eighth worst-case waveform segment of the plurality of waveform segments, and wherein the display is configured to display an overlay of the first worst-case waveform segment, second worst-case waveform segment, third worst-case waveform segment, fourth worst-case waveform segment, fifth worst-case waveform segment, sixth worst-case waveform segment, seventh worst-case waveform, and eighth worst-case waveform from the plurality of waveform segments, to form the fast worst-case real-time eye diagram.

9. The IRTO of claim 8, wherein the WRTER module is configured to determine a first thousand waveform segments that have first time difference values that are approximately equal to the first worst-case time difference value, determine a second thousand waveform segments that have second time difference values that are approximately equal to the second worst-case time difference value, determine a third thousand waveform segments that have third time difference values that are approximately equal to the third worst-case time difference value, determine a fourth thousand waveform segments that have fourth time difference values that are approximately equal to the fourth worst-case time difference value, determine a fifth thousand waveform segments that have fifth time difference values that are approximately equal to the fifth worst-case time difference value, determine a sixth thousand waveform segments that have sixth time difference values that are approximately equal to the sixth worst-case time difference value, determine a seventh thousand waveform segments that have seventh time difference values that are approximately equal to the seventh worst-case time difference value, determine an eighth thousand waveform segments that have eighth time difference values that are approximately equal to the eighth worst-case time difference value, and determine a ninth thousand waveform segments that have ninth time difference values that are approximately equal to the ninth worst-case time difference value, wherein the display is configured to display an overlay of the first worst-case waveform segment, second worst-case waveform segment, third worst-case waveform segment, fourth worst-case waveform segment, fifth worst-case waveform segment, sixth worst-case waveform segment, seventh worst-case waveform, eighth worst-case waveform, first thousand waveform segments, second thousand waveform segments, third thousand waveform segments, fourth thousand waveform segments, fifth thousand waveform segments, sixth thousand waveform segments, seventh thousand waveform segments, eighth thousand waveform segments, and ninth thousand waveform segments from the plurality of waveform segments, to form the fast worst-case real-time eye diagram.

10. The IRTO of claim 9 further including a recovered memory in signal communication with the CDR module and WRTER module.

11. An improved real-time oscilloscope ("IRTO") for generating a fast worst-case real-time eye diagram from an input signal, the IRTO comprising:

means for receiving the input signal and, in response, produce an adjusted input signal;

a digitizer in signal communication with the receiving means, wherein the digitizer is configured to receive the adjusted input signal and, in response, produce a digitized waveform;

an acquisition memory in signal communication with the digitizer, wherein the acquisition memory is configured to receive and store the digitized waveform received from the digitizer;

means for detecting a plurality of transitions in the digitized waveform;

means for determining a plurality of first threshold crossings and a plurality of second threshold crossings, wherein each first threshold crossing and each second threshold crossing corresponds to a transition of the plurality of transitions;

means for determining a plurality of waveform segments of the digitized waveform, wherein each waveform segment corresponds to a transition of the plurality of transitions;

means for recovering a plurality of recovered clocks from the digitized waveform, wherein each recovered clock of the plurality of clocks corresponds to a transition of the plurality of transitions;

means for determining a plurality of first time difference values from the plurality of first threshold crossings and the plurality of recovered clocks, wherein each first time difference value corresponds to a first time difference between a first threshold crossing, of a transition of the plurality of transitions, and a recovered clock corresponding to that transition;

means for determining a plurality of second time difference values from the plurality of second threshold crossings and the plurality of recovered clocks, wherein each second time difference value corresponds to a second time difference between a second threshold crossing, of a transition of the plurality of transitions, and a recovered clock corresponding to that transition;

means for determining a first worst-case time difference value from the plurality of first time difference values, wherein the first worst-case time difference corresponds to a first worst-case waveform segment of the plurality of waveform segments;

means for determining a second worst-case time difference value from the plurality of second time difference values, wherein the second worst-case time difference corresponds to a second worst-case waveform segment of the plurality of waveform segments; and means for displaying an overlay of the first worst-case waveform segment and second worst-case waveform segment, from the plurality of waveform segments, to form the fast worst-case real-time eye diagram.

12. A method for generating a fast worst-case real-time eye diagram from a received input signal on an improved real-time oscilloscope ("IRTO"), the method comprising:

digitizing the received input signal to produce a digitized waveform;

storing the digitized waveform;

detecting a plurality of transitions in the digitized waveform, wherein detecting the plurality of transitions includes determining a plurality of first threshold crossings and a plurality of second threshold crossings, wherein each first threshold crossing and each second threshold crossing corresponds to a transition of the plurality of transitions;

determining a plurality of waveform segments of the digitized waveform, wherein each waveform segment corresponds to a transition of the plurality of transitions;

recovering a plurality of recovered clocks from the digitized waveform, wherein each recovered clock of the plurality of clocks corresponds to a transition of the plurality of transitions;

determining a plurality of first time difference values from the plurality of first threshold crossings and the plurality of recovered clocks, wherein each first time difference value corresponds to a first time difference between a first threshold crossing, of a transition of the plurality of transitions, and a recovered clock corresponding to that transition;

determining a plurality of second time difference values from the plurality of second threshold crossings and the plurality of recovered clocks, wherein each second time difference value corresponds to a second time difference between a second threshold crossing, of a transition of the plurality of transitions, and a recovered clock corresponding to that transition;

determining a first worst-case time difference value from the plurality of first time difference values, wherein the first worst-case time difference corresponds to a first worst-case waveform segment of the plurality of waveform segments;

determining a second worst-case time difference value from the plurality of second time difference values, wherein the second worst-case time difference corresponds to a second worst-case waveform segment of the plurality of waveform segments; and displaying an overlay of the first worst-case waveform segment and second worst-case waveform segment, from the plurality of waveform segments, to form the fast worst-case real-time eye diagram.

13. The method of claim 12, wherein detecting a plurality of transitions in the digitized waveform includes determining a plurality of third threshold crossings, wherein each third threshold crossing corresponds to a transition in the plurality of transitions, and wherein each first threshold crossing occurs at a first threshold voltage, each second threshold crossing occurs at a second threshold voltage, and each third threshold crossing occurs at a third threshold voltage, and wherein the third threshold voltage is greater than the second threshold voltage and less than the first threshold voltage value.

14. The method of claim 13, wherein the digitized waveform has an voltage amplitude range, wherein the first threshold voltage is equal to eighty percent of the voltage amplitude range, wherein the second threshold voltage is equal to twenty percent of the voltage amplitude range, and wherein the third threshold voltage is equal to fifty percent of the voltage amplitude range.

15. The method of claim 13, further including determining a plurality of third time difference values from the plurality of third threshold crossings and the plurality of recovered clocks, wherein each third time difference value corresponds to a third time difference between a third threshold crossing, of a transition of the plurality of transitions, and a recovered clock corresponding to that transition, determining a third worst-case time difference value from the plurality of third time difference values, wherein the third worst-case time difference corresponds to a third worst-case waveform segment of the plurality of waveform segments, and wherein displaying includes displaying an overlay of the first worst-case waveform segment, second worst-case waveform segment, and a third worst-case waveform segment from the plurality of waveform segments, to form the fast worst-case real-time eye diagram.

16. The method of claim 15, wherein detecting a plurality of transitions in the digitized waveform includes determining a plurality of rising edge transitions and plurality of failing edge transitions, where each transition in the plurality of transitions is a rising edge transition or a failing edge transition, wherein each first threshold crossing, second threshold crossing, and third threshold crossing corresponds to a rising edge transition in the plurality of rising edge transitions, wherein detecting the plurality of transitions further includes determining a plurality of fourth threshold crossings, plurality of fifth threshold crossings, and plurality of sixth threshold crossings, wherein each fourth threshold crossing, fifth threshold crossing, and sixth threshold crossing corresponds to a failing edge transition of the plurality of failing edge transitions, and wherein each fourth threshold crossing occurs at the first threshold voltage, each fifth threshold crossing occurs at the second threshold voltage, and each sixth threshold crossing occurs at the third threshold voltage.

17. The method of claim 16, further including determining a plurality of fourth time difference values from the plurality of fourth threshold crossings, wherein each fourth time difference value corresponds to a fourth time difference between a fourth threshold crossing, of a failing edge transition of the plurality of transitions, and a recovered clock corresponding to that failing edge transition, determining a plurality of fifth time difference values from the plurality of fifth threshold crossings and the plurality of recovered clocks, wherein each fifth time difference value corresponds to a fifth time difference between a fifth threshold crossing, of a failing edge transition of the plurality of transitions, and a recovered clock corresponding to that failing edge transition, determining a plurality of sixth time difference values from the plurality of sixth threshold crossings and the plurality of recovered clocks, wherein each sixth time difference value corresponds to a sixth time difference between a sixth threshold crossing, of a failing edge transition of the plurality of transitions, and a recovered clock corresponding to that failing edge transition, determining a fourth worst-case time difference value from the plurality of fourth time difference values, wherein the fourth worst-case time difference corresponds to a fourth worst-case waveform segment of the plurality of waveform segments, determining a fifth worst-case time difference value from the plurality of fifth time difference values, wherein the fifth worst-case time difference corresponds to a fifth worst-case waveform segment of the plurality of waveform segments, determining a sixth worst-case time difference value from the plurality of sixth time difference values, wherein the sixth worst-case time difference corresponds to a sixth worst-case waveform segment of the plurality of waveform segments, and wherein displaying includes displaying an overlay of the first worst-case waveform segment, second worst-case waveform segment, third worst-case waveform segment, fourth worst-case waveform segment, fifth worst-case waveform segment, and sixth worst-case waveform segment from the plurality of waveform segments, to form the fast worst-case real-time eye diagram.

18. The method of claim 17, wherein the digitized waveform has an voltage amplitude range, wherein the first threshold voltage is equal to eighty percent of the voltage amplitude range, wherein the second threshold voltage is equal to twenty percent of the voltage amplitude range, and wherein the third threshold voltage is equal to fifty percent of the voltage amplitude range.

19. The method of claim 17, further including
determining a plurality of voltage logic ONE values from the plurality of waveform segments, wherein each voltage logic ONE value corresponds to a voltage of a waveform segment, of the plurality of waveform segments, at a time value corresponding to the recovered clock that corresponds to the waveform segment,
determining a plurality of voltage logic ZERO values from the plurality of waveform segments, wherein each voltage logic ZERO value corresponds to a voltage of a waveform segment, of the plurality of waveform segments, at a time value corresponding to the recovered clock that corresponds to the waveform segment,
determining a lowest voltage logic ONE value from the plurality of voltage logic ONE values, wherein the lowest voltage logic ONE value corresponds to a seventh worst-case waveform segment of the plurality of waveform segments, and
determining a highest logic ZERO value from the plurality of voltage logic ZERO values, wherein the highest logic ZERO value corresponds to an eighth worst-case waveform segment of the plurality of waveform segments, and
wherein displaying includes displaying an overlay of the first worst-case waveform segment, second worst-case waveform segment, third worst-case waveform segment, fourth worst-case waveform segment, fifth worst-case waveform segment, sixth worst-case waveform segment, seventh worst-case waveform, and eighth worst-case waveform from the plurality of waveform segments, to form the fast worst-case real-time eye diagram.

20. The method of claim 19, further including
determining a first thousand waveform segments that have first time difference values that are approximately equal to the first worst-case time difference value,
determining a second thousand waveform segments that have second time difference values that are approximately equal to the second worst-case time difference value,
determining a third thousand waveform segments that have third time difference values that are approximately equal to the third worst-case time difference value,
determining a fourth thousand waveform segments that have fourth time difference values that are approximately equal to the fourth worst-case time difference value,
determining a fifth thousand waveform segments that have fifth time difference values that are approximately equal to the fifth worst-case time difference value,
determining a sixth thousand waveform segments that have sixth time difference values that are approximately equal to the sixth worst-case time difference value,
determining a seventh thousand waveform segments that have seventh time difference values that are approximately equal to the seventh worst-case time difference value,
determining an eighth thousand waveform segments that have eighth time difference values that are approximately equal to the eighth worst-case time difference value, and
determining a ninth thousand waveform segments that have ninth time difference values that are approximately equal to the ninth worst-case time difference value, and
wherein displaying includes displaying an overlay of the first worst-case waveform segment, second worst-case waveform segment, third worst-case waveform segment, fourth worst-case waveform segment, fifth worst-case waveform segment, sixth worst-case waveform segment, seventh worst-case waveform, eighth worst-case waveform, first thousand waveform segments, second thousand waveform segments, third thousand waveform segments, fourth thousand waveform segments, fifth thousand waveform segments, sixth thousand waveform segments, seventh thousand waveform segments, eighth thousand waveform segments, and ninth thousand waveform segments from the plurality of waveform segments, to form the fast worst-case real-time eye diagram.

* * * * *